(12) United States Patent
Kitagawa et al.

(10) Patent No.: US 8,881,383 B2
(45) Date of Patent: Nov. 11, 2014

(54) COMPONENT MOUNTING DEVICE AND COMPONENT MOUNTING METHOD

(75) Inventors: Yoshiyuki Kitagawa, Yamanashi (JP); Shuzo Yagi, Yamanashi (JP); Takeyuki Kawase, Yamanashi (JP)

(73) Assignee: Panasonic Corporation, Osaka (JP)

( * ) Notice: Subject to any disclaimer, the term of this patent is extended or adjusted under 35 U.S.C. 154(b) by 141 days.

(21) Appl. No.: 13/580,029

(22) PCT Filed: Jan. 19, 2012

(86) PCT No.: PCT/JP2012/000318
§ 371 (c)(1),
(2), (4) Date: Aug. 20, 2012

(87) PCT Pub. No.: WO2012/098892
PCT Pub. Date: Jul. 26, 2012

(65) Prior Publication Data
US 2012/0317803 A1 Dec. 20, 2012

(30) Foreign Application Priority Data
Jan. 20, 2011 (JP) .................... 2011-009648

(51) Int. Cl.
*H05K 3/30* (2006.01)
*H05K 13/04* (2006.01)
*H05K 13/08* (2006.01)

(52) U.S. Cl.
CPC ............ *H05K 13/0452* (2013.01); *H05K 13/08* (2013.01); *Y10S 901/20* (2013.01)
USPC .................. 29/832; 29/469; 29/559; 29/721; 29/729; 29/854; 361/233; 361/234; 414/737; 414/749.3; 901/20

(58) Field of Classification Search
CPC ......... H25K 7/026; H25K 7/18; H25K 7/183; H25K 13/0023; H25K 13/003; H25K 13/0069; H25K 13/02; H25K 13/022; H25K 13/04; H25K 13/0404; H25K 13/0452; H25K 13/046; H25K 13/0482; H25K 13/0486; H25K 13/0495; H25K 13/08

USPC ........... 29/428, 469, 559, 721, 729, 739, 740, 29/742, 760, 831, 832, 834, 836, 846, 29/854; 361/233, 234; 414/737, 749.3; 901/20

See application file for complete search history.

(56) References Cited

U.S. PATENT DOCUMENTS

| 7,010,853 | B2 * | 3/2006 | Oe ............................ 29/740 |
| 7,036,215 | B2 * | 5/2006 | Kodama ..................... 29/832 |

(Continued)

FOREIGN PATENT DOCUMENTS

| JP | 2003-133800 A | 5/2003 |
| JP | 2004-128400 A | 4/2004 |

(Continued)

OTHER PUBLICATIONS

International Search Report for PCT/JP2012/000318 dated Feb. 14, 2012.

*Primary Examiner* — Paul D Kim
(74) *Attorney, Agent, or Firm* — Pearne & Gordon LLP

(57) ABSTRACT

In a component mounting device (1) which includes a first mounting lane (L1) and a second mounting lane (L2) and for which an independence mounting mode and an alternation mounting mode are selectable, a first limited movable area (R1A) and a first limited movable area (R1B) in which the movements in the horizontal direction of a first mounting head (13A) and a second mounting head (13B) of the mounting lanes are permitted in the independence mounting mode, are set as areas different from second limited movable areas in the alternation mounting mode, to prevent the mounting head of the mounting lane which is continuously operating from entering into the area of the mounting lanes for which the device type changing operation is being performed.

2 Claims, 10 Drawing Sheets

(56) References Cited

U.S. PATENT DOCUMENTS

| | | |
|---|---|---|
| 7,587,814 B2 * | 9/2009 | Suhara .............................. 29/740 |
| 8,276,264 B2 * | 10/2012 | Shimizu et al. .................. 29/739 |
| 8,447,566 B2 * | 5/2013 | Maenishi ....................... 702/182 |
| 2004/0128827 A1 | 7/2004 | Shimizu et al. |
| 2009/0241327 A1 | 10/2009 | Kashitani et al. |
| 2010/0050426 A1 | 3/2010 | Shimizu et al. |
| 2010/0325860 A1 | 12/2010 | Maenishi |
| 2012/0317803 A1 * | 12/2012 | Kitagawa et al. ................ 29/832 |
| 2012/0324725 A1 * | 12/2012 | Kitagawa et al. ................ 29/832 |
| 2013/0000114 A1 * | 1/2013 | Kitagawa et al. ................ 29/832 |
| 2013/0025118 A1 * | 1/2013 | Miyake ........................... 29/739 |

FOREIGN PATENT DOCUMENTS

| | | |
|---|---|---|
| JP | 2009-231722 A | 10/2009 |
| JP | 2009-239257 A | 10/2009 |

* cited by examiner

COMPONENT MOUNTING DEVICE AND COMPONENT MOUNTING METHOD

TECHNICAL FIELD

The present invention relates to a component mounting device and a component mounting method that mount electronic components on boards.

BACKGROUND ART

An electronic component mounting system which manufactures a mounted board by mounting electronic components on the board is formed by combining a plurality of component mounting devices which mount the electronic components on the board on which paste for solder bonding was printed. In recent years, in the electronic industry, with the development of the diversification of production patterns, the production pattern in which multiple types of products are manufactured in a limited quantity is also increasingly applied in the field of component mounting. Therefore, in the component mounting system, the frequency of device type changing operations with the change of the type of the board which is a working object increases. Various schemes are proposed to effectively perform device type changing operations for the purpose of improving the productivity in the production field of the component mounting (for example, refer to a patent document 1). In the prior art shown in the patent document, a preparation mode in which an operator performs device type changing operations can be selected other than a mounting mode in which mounting operations are performed, and in the preparation mode, even if a moving part detects an obstacle or it is detected that the opening and closing cover of a device is opened, the power supplying part will be kept in an ON state. Therefore, there is an effect that it is not necessary to perform a resetting operation at the time of resuming mounting operations after the preparation operation is finished.

RELATED ART DOCUMENT

Patent Documents

Patent document 1: Japan Patent Publication No. 2003-133800

SUMMARY OF THE INVENTION

Problems to be Solved by the Invention

It is known that a component mounting device includes two independent mounting lanes both of which include a board conveying mechanism that conveys boards and a component mounting mechanism that mounts components on the boards. With such a structure, component mounting operations can be performed concurrently on two different types of boards by the two mounting lanes. However, because the timing of the end of one production lot varies for each of the mounting lanes in the component mounting device of the above structure, it is necessary to perform the device type changing operation for each of the mounting lanes with the change of the board type. In view of improving the operating rate of the device, it is desirable to perform the device type changing operation only for the mounting lane whose production lot is finished without stopping the operation of the working mounting lane.

However, because the device type changing operation is accompanied with manual operations performed by an operator such as the replacement of a component supply device such as a tape feeder which supplies components to the component mounting mechanism and the replacement of an adsorbing nozzle which is used in the component mounting mechanism, in order to make it possible to perform the device type changing operation in one mounting lane while the other mounting lane is working, in the prior art, it is necessary to stop both mounting lanes so that the safety of the operator will not be impaired and the productivity is forced to drop when the device type changing is performed at a high frequency. Therefore, there is a demand for a component mounting device and a component mounting method which make it possible to perform the device type changing operation with the change of the board type in the component mounting device which includes a plurality of mounting lanes, without stopping the operation of the other mounting lane and without impairing the safety of the operator.

Therefore, the invention is intended to provide a component mounting device and a component mounting method which make it possible to perform the device type changing operation with the change of the board type in the component mounting device which includes a plurality of mounting lanes, without stopping the operation of the other working mounting lane and without impairing the safety of the operator.

Solution for Solving the Problem

A component mounting device of this invention, comprises:

a first board conveying mechanism and a second board conveying mechanism which convey boards delivered from an upstream device in a board conveying direction, and have board holding parts which position and hold the boards, respectively; a first component supplying part and a second component supplying part which are provided respectively beside the first board conveying mechanism and the second board conveying mechanism and supply components to be mounted on the boards;

a first component mounting mechanism and a second component mounting mechanism which take out the components with mounting heads from the first component supplying part and the second component supplying part which are provided respectively in accordance with the first board conveying mechanism and the second board conveying mechanism and mount on the boards which are held by a board holding part of the first board conveying mechanism and a board holding part of the second board conveying mechanism; and a mounting controlling part which controls a first mounting lane composed of the first board conveying mechanism, the first component supplying part and the first component mounting mechanism and a second mounting lane composed of the second board conveying mechanism, the second component supplying part and the second component mounting mechanism, based on mounting data stored in a storage part;

wherein the mounting data contains a first mounting data corresponding to a first operation mode in which any one of the component mounting mechanisms performs component mounting operations only on the boards which are held by the board holding part of the board conveying mechanism corresponding to the any one of the component mounting mechanisms, and a second mounting data which correspond to a second operation mode in which any one of the component mounting mechanisms performs component mounting operations on the boards which are held by the board holding parts of both the first board conveying mechanism and the second board conveying mechanism, and a first limited movable area and a second limited movable area which respectively indicate areas in which movements of the mounting heads in the horizontal direction in the first mounting lane and the second mounting lane are permitted are set as different areas in accordance with the first operation mode and the second operation mode, respectively, in the first mounting data and the second mounting data.

A component mounting method of this invention with which components are mounted on boards by a component mounting device comprising a first board conveying mechanism and a second board conveying mechanism which convey the boards delivered from upstream devices in board conveying directions, and have board holding parts which position and hold the boards, respectively, a first component supplying part and a second component supplying part which are provided respectively beside the first board conveying mechanism and the second board conveying mechanism and supply the components to be mounted on the boards, and a first component mounting mechanism and a second component mounting mechanism which take out the components with mounting heads from the first component supplying part and the second component supplying part which are provided respectively in accordance with the first board conveying mechanism and the second board conveying mechanism and mount on the boards which are held by a board holding part of the first board conveying mechanism and a board holding part of the second board conveying mechanism, comprising a mounting data storing step of storing mounting data which contain first mounting data which correspond to a first operation mode in which any one of the component mounting mechanisms performs component mounting operations only on the boards which are held by the board holding part of the board conveying mechanism corresponding the any one of the component mounting mechanisms and second mounting data which correspond to a second operation mode in which any one of the component mounting mechanisms performs component mounting operations on the boards which are held by the board holding parts of both the first board conveying mechanism and the second board conveying mechanism, in a storing part, and a mounting control step of controlling a first mounting lane which comprises the first board conveying mechanism, the first component supplying part and the first component mounting mechanism and a second mounting lane which comprises the second board conveying mechanism, the second component supplying part and the second component mounting mechanism, based on the mounting data, wherein before the mounting data storing step, first limited movable areas and second limited movable areas which respectively indicate areas in which the movements in the horizontal direction of the mounting heads in the first mounting lane and the second mounting lane are permitted are set as different areas in accordance with the first operation mode and the second operation mode, respectively, in the first mounting data and the second mounting data Effects of the Invention According to the present invention, by setting the first limited movable areas and the second limited movable areas which indicate the areas in which the mounting heads in the first mounting lane and the second mounting lane are allowed to move horizontally as different areas respectively in accordance with the first operation mode and the second operation mode, in the first mounting data which corresponds to the first operation mode in which component mounting operations are performed by one component mounting mechanism only on the boards which are held by the board holding part of the board conveying mechanism which corresponds to the component mounting mechanism, and the second mounting data which corresponds to the second operation mode in which component mounting operations are performed by one component mounting mechanism on the boards which are held by the board holding parts of both the first board conveying mechanism and the second board conveying mechanism, the mounting head of the mounting lane which is operating in the first operation mode during the device type changing operation can be prohibited from moving to the mounting lane for which the device type changing operation is being performed, and the device type changing operation with the change of the board type can be performed in the component mounting device which includes a plurality of mounting lanes, without stopping the operation of the working mounting lane and without impairing the safety of the operator.

EMBODIMENTS OF THE INVENTION

Figure 1:
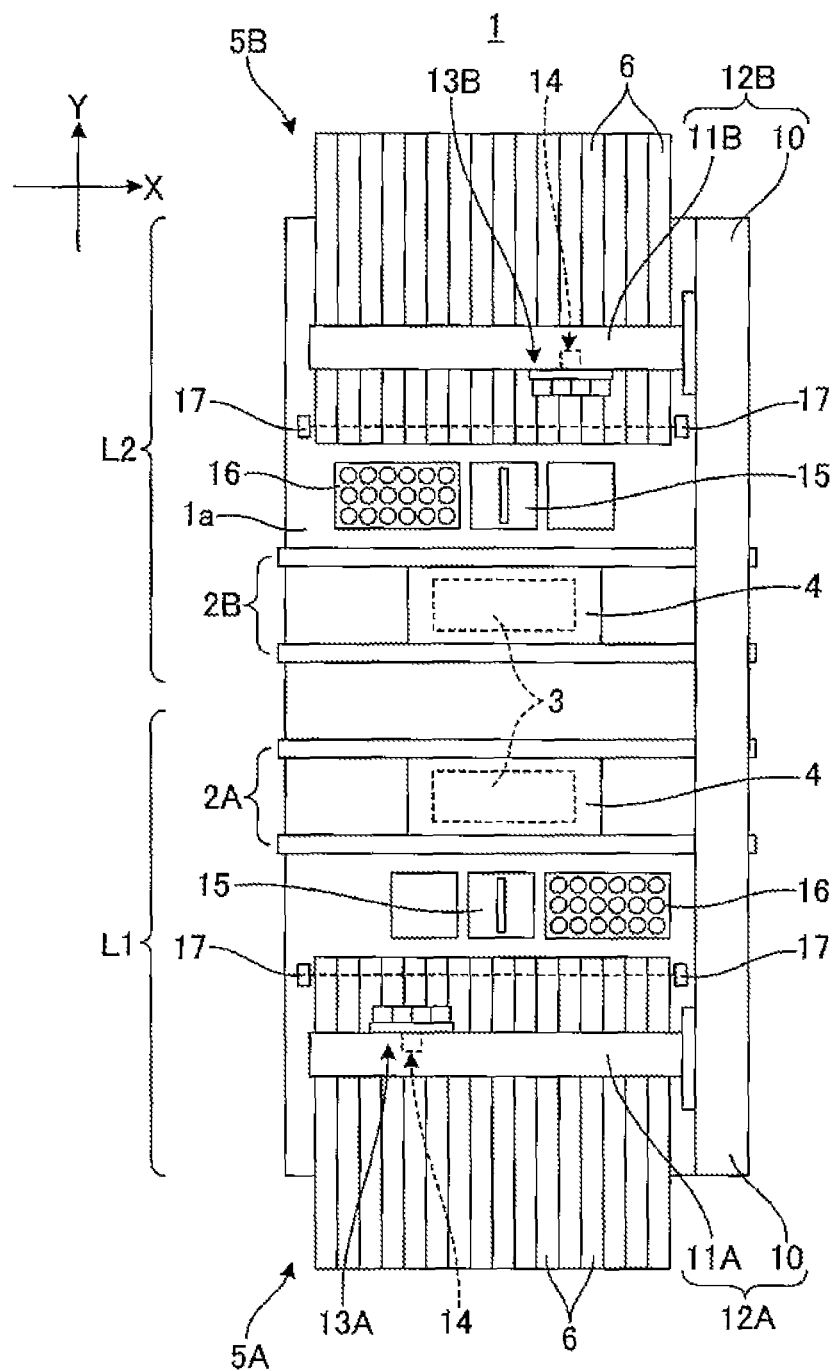
FIG. 1 is a top view of a component mounting device of one embodiment of the present invention.

Next, an embodiment of the invention is described with reference to the figures. First, the structure of a component mounting device 1 is described with reference to FIGS. 1 and 2. In FIG. 1, a first board conveying mechanism 2A and a second board conveying mechanism 2B are provided in an X direction (board conveying direction) in the central part of a base 1a, and convey boards 4, which are delivered from upstream devices, respectively, to the downstream side in the X direction. The first board conveying mechanism 2A and the second board conveying mechanism 2B have a board holding part 3, respectively, and the boards 4 which are conveyed from upstream are positioned and held at mounting operation positions in accordance with component mounting mechanisms described below by the board holding parts 3.

Figure 2:
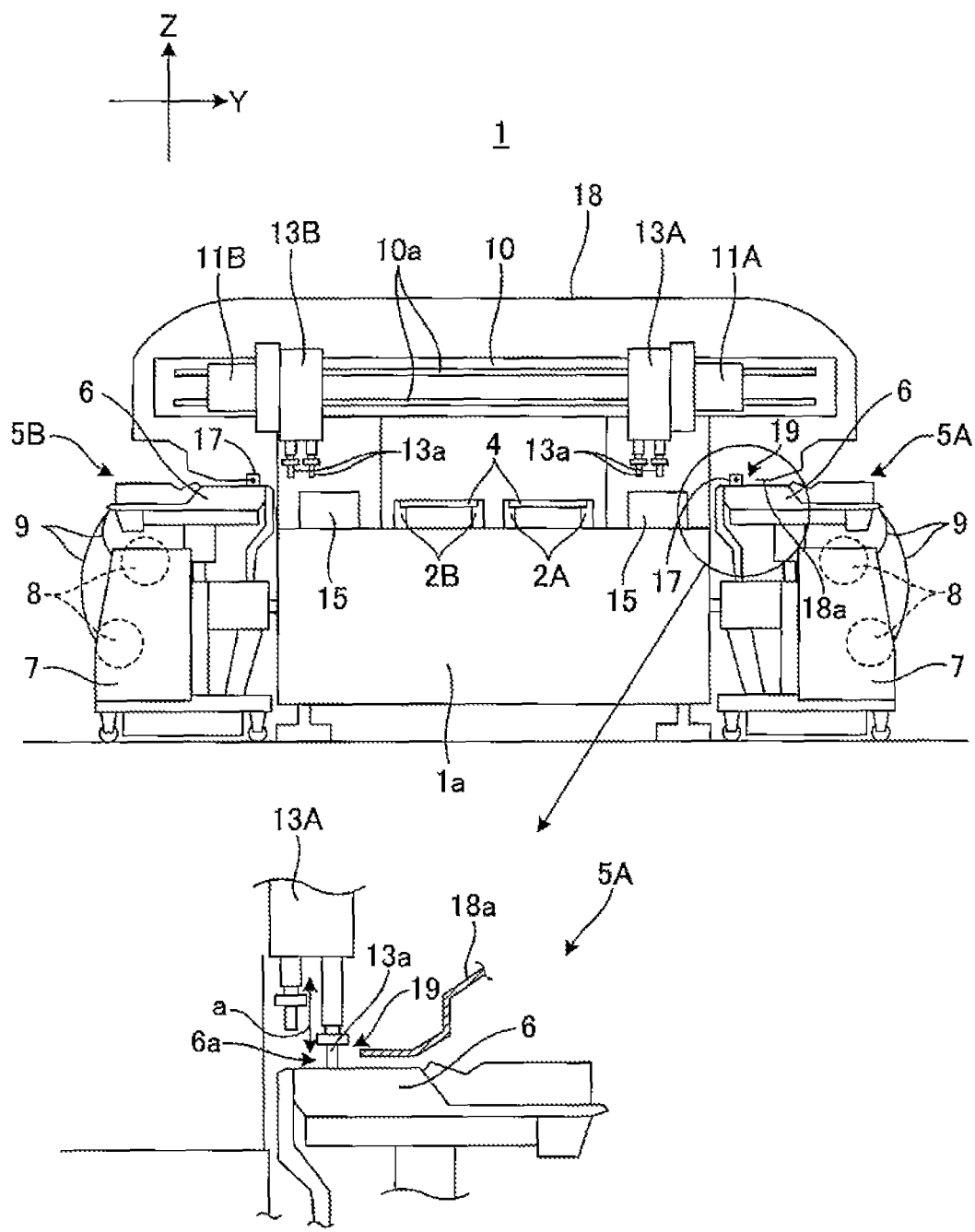
FIG. 2 is a sectional view of the component mounting device of the embodiment of the present invention.

A first component supplying part 5A and a second component supplying part 5B, which supply components which are to be mounted on the boards 4, are provided at the outer sides of the first board conveying mechanism 2A and the second board conveying mechanism 2B, respectively. As shown in FIG. 2, a carriage 7 on which a plurality of tape feeders 6 are arranged is installed in each of the first component supplying part 5A and the second component supplying part 5B. By drawing out carrier tapes 9 which receive and hold components from supply reels 8 and pitch sending, the tape feeder 6 supplies these components to component retrieving positions in accordance with the component mounting mechanisms. When the type of boards which are mounted objects is to be changed, the plurality of the tape feeders 6 can be collectively changed by detaching the carriage 7 from the first component supplying part 5A or the second component supplying part 5B.

In the present embodiment, although an example is shown in which the carriages 7, in which the tape feeders 6 are arranged, are respectively installed in the first component supplying part 5A and the second component supplying part 5B, either of the first component supplying part 5A and the second component supplying part 5B may have a structure in which parts feeders other than the tape feeders 6, such as tray feeders, are arranged. In other words, the tape feeders 6 which supply components held in the carrier tapes are installed in parallel in at least one of the first component supplying part 5A and the second component supplying part 5B.

A Y axis movable table 10 which includes a linear driving mechanism is disposed horizontally in a Y direction at one end of the base 1a in the X direction, and a first X axis movable table 11A and a second X axis movable table 118 which similarly include a linear driving mechanism, are slidably coupled to the Y axis movable table 10 along guide rails 10a. A first mounting head 13A and a second mounting head 13B are installed slidably in the X direction at the first X axis movable table 11A and the second X axis movable table 118, respectively. The Y axis movable table 10 and the first X axis movable table 11A, and the Y axis movable table 10 and the second X axis movable table 11B form a first head moving mechanism 12A and a second head moving mechanism 12B, respectively.

The first mounting head 13A and the second mounting head 13B are moved horizontally in the X direction and the Y direction by driving the first head moving mechanism 12A and the second head moving mechanism 12B. The components from the tape feeders 6 of the first component supplying part 5A and the second component supplying part 5B are respectively taken out and mounted on the boards 4 which are respectively positioned and held by the board holding parts 3 of the first board conveying mechanism 2A and the second board conveying mechanism 2B, by adsorbing nozzles 13a which are installed at the lower ends of the first mounting head 13A and the second mounting head 13B, respectively.

That is, the combination of the first head moving mechanism 12A and the first mounting head 13A, and the combination of the second head moving mechanism 12B and the second mounting head 13B are provided respectively in correspondence with the first board conveying mechanism 2A and the second board conveying mechanism 2B, and form a first component mounting mechanism and a second component mounting mechanism which take out components from the first component supplying part 5A and the second component supplying part 5B and mount the components on the boards 4 which are held by the board holding parts 3 of the first board conveying mechanism 2A and the second board conveying mechanism 2B, respectively.

Board recognition cameras 14 which move integrally with the first mounting head 13A and the second mounting head 13B, respectively, are provided at the bottom sides of the first X axis movable table 11A and the second X axis movable table 11B. The board recognition cameras 14 respectively image the boards 4 when the first mounting head 13A and the second mounting head 13B move over the boards 4 on the first board conveying mechanism 2A and the second board conveying mechanism 2B, respectively. Further, component recognition cameras 15 and nozzle receiving parts 16 are disposed between the first component supplying part 5A and the first board conveying mechanism 2A, and between the second component supplying part 5B and the second board conveying mechanism 2B, respectively.

When the first mounting head 13A and the second mounting head 13B which take out the components from the first component supplying part 5A and the second component supplying part 5B move over the component recognition cameras 15, the component recognition cameras 15 image the components which are held by the first mounting head 13A and the second mounting head 13B. A plurality of types of absorbing nozzles 13a are received in the nozzle receiving parts 16 in accordance with the types of components which are mounted objects, and the adsorbing nozzles 13a can be changed in accordance with the type of the components by making the first mounting head 13A and the second mounting head 13B access the nozzle receiving parts 16, and perform nozzle exchanging actions.

A component mounting position in the board 4 is recognized when a recognition processing part 25 (refer to FIG. 3) performs a recognition process on an imaging result of the board recognition camera 14, and the recognition and the positional deviation detection of a component which is held by the first mounting head 13A or the second mounting head 13B are performed with a recognition process on an imaging result of the component recognition camera 15. An on-board position is revised by taking these recognition results into consideration in component mounting actions of the first component mounting mechanism or the second component mounting mechanism.

In the component mounting device 1, the first board conveying mechanism 2A, the first component supplying part 5A, the first head moving mechanism 12A and the first mounting head 13A form a first mounting lane L1 which performs component mounting operations on the board 4 which is conveyed along the first board conveying mechanism 2A. Similarly, the second board conveying mechanism 2B, the second component supplying part 5B, the second head moving mechanism 12B and the second mounting head 13B form a second mounting lane L2 which performs component mounting operations on the board 4 which is conveyed along a series of board conveying lanes which are coupled to the second board conveying mechanism 23.

The above-mentioned first mounting lane L1 and the second mounting lane L2, as shown in FIG. 2, are enclosed by a whole cover member 18 which cover the Y axis movable table 10, the first X axis movable table 11A and the second X axis movable table 113 from above. Protective cover parts 18a which are provided at two ends of the whole cover member 18 in the Y direction extend from outside and above the carriages 7 in which the tape feeders 6 are arranged in the first component supplying part 5A and the second component supplying part 5B, and separate the movable areas of the component mounting mechanisms, namely the movable areas of the first mounting head 13A and the second mounting head 13B from the first component supplying part 5A and the second component supplying part 5B, respectively. Thereby, an operator who performs operations on the first component supplying part 5A or the second component supplying part 5B does not touch the first mounting head 13A or the second mounting head 13B that is acting, and the safety of the operator can be secured at the time of performing the operations.

As shown in the enlarged view of FIG. 2, an opening part 19 of a predetermined opening size, which is necessary for the adsorbing nozzles 13a to adsorb a component, is provided at the end of the protective cover part 18a correspondingly above the component retrieving positions 6a of the tape feeders 6. In component mounting actions, the first mounting head 13A and the second mounting head 13B move to the first component supplying part 5A and the second component supplying part 5B, respectively. Components are picked up from the component retrieving positions 6a of the tape feeders 6 by making the adsorption nozzles 13a move up and down through the opening part 19 (arrow a).

In each of the first component supplying part 5A and the second component supplying part 5B, tape feeder float detecting sensors 17 are disposed in the opening area of the opening part 19 which is above the front ends of the tape feeders 6 which are arranged in the carriage 7. The tape feeder float detection sensors 17 are light barrier type optic sensors, and are provided to detect whether the mounting states of the tape feeders 6 are abnormal when the carriage 7 is installed in the first component supplying part 5A or the second component supplying part 5B, for example, whether a tape feeder 6 which is arranged in the carriage 7 has floated from a feeder base. In this embodiment, beside the object of detecting the mounting states of the tape feeders 6, the tape feeder float detecting sensors 17 are also used to secure the safety of an operator at the time of a device type changing operation.

In other words, because the opening part 19 which is provided in the first component supplying part 5A or the second component supplying part 5B may be accessed by an operator when the carriage 7 is separated, if the first mounting head 13A or the second mounting head 13B acts when a part of the body of the operator or a foreign object enters through the opening part 19, a non-safety state might be caused. To prevent such a non-safety state, the tape feeder float detecting sensors 17 are used as optical sensors to secure the safety of the operator.

Figure 3:
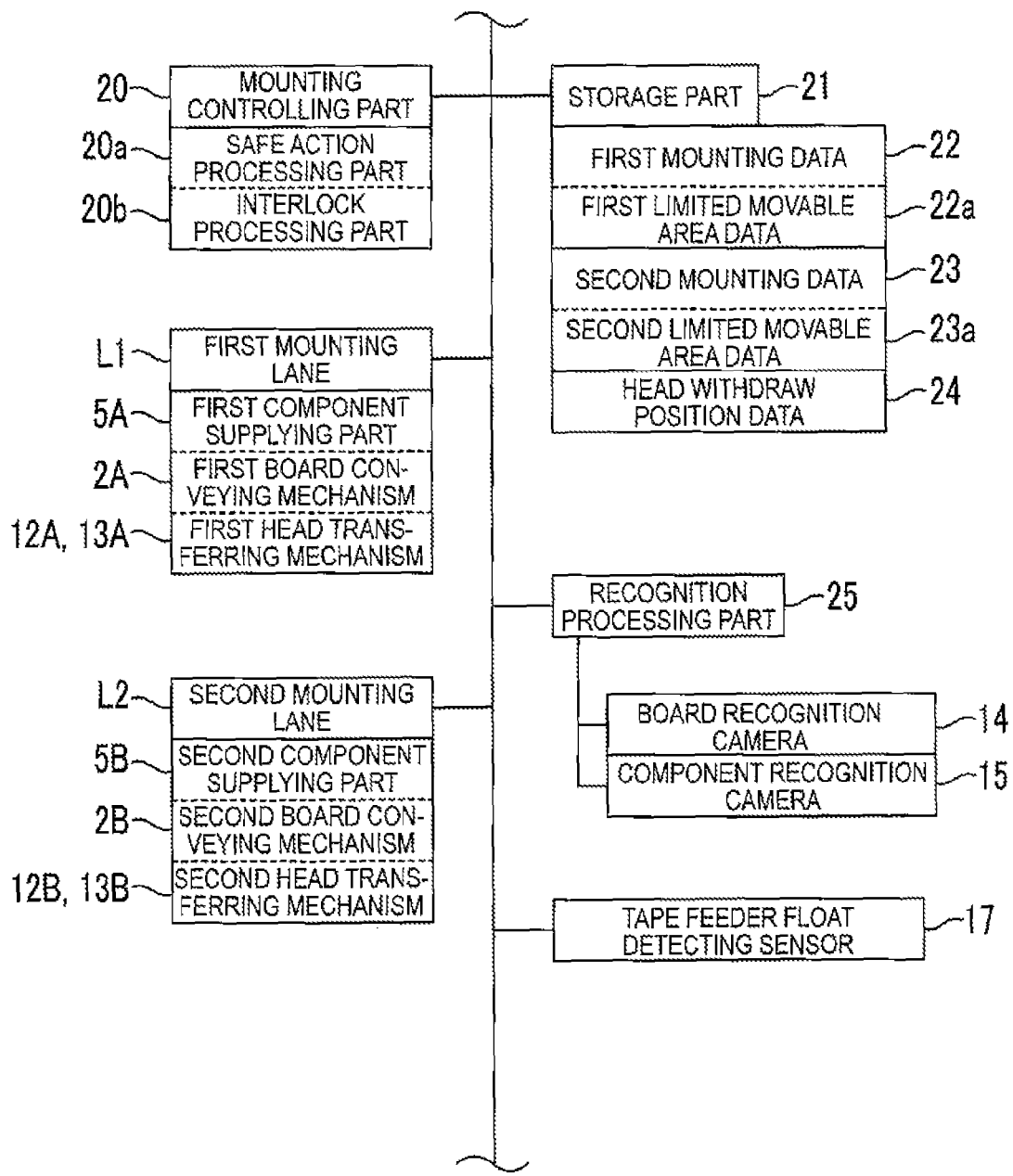
FIG. 3 is a block diagram which shows the structure of a control system of the component mounting device of the embodiment of the present invention.

For example, if a tape feeder float detecting sensor 17 detects a part of the body or a foreign object, such as fingers of the operator or an operation tool, a detection signal is transmitted to a mounting controlling part 20 (FIG. 3). An interlock processing part 20b of the mounting controlling part 20 stops the operation of the component mounting mechanism which belong to the mounting lane opposite to the mounting lane to which the component supplying part, in which the tape feeder float detecting sensor 17 is provided, belongs. That is, in this embodiment, the tape feeder float detecting sensors 17 which are provided to detect whether the mounting states of the tape feeders 6 are abnormal are used as the optical sensors to secure the safety of the operator.

Next, the structure of a control system is described with reference to FIG. 3. In FIG. 3, the mounting controlling part 20 controls the following components which form the component mounting device 1 based on various data stored in a storage part 21. That is, the mounting controlling part 20 controls the first mounting lane L1 which is formed of the first board conveying mechanism 2A, the first component supplying part 5A and the first component mounting mechanism (the first head moving mechanism 12A and the first mounting head 13A), and the second mounting lane L2 which is formed of the second board conveying mechanism 2B, the second component supplying part 5B and the second component mounting mechanism (the second head moving mechanism 12B and the second mounting head 13B).

The mounting controlling part 20 includes a safe action processing part 20a and the interlock processing part 20b as internal processing functions. The safe action processing part 20a performs processes to prescribe the actions of the components according to predetermined acting conditions to secure the safety of an operator in component mounting operations. The interlock processing part 20b performs processes to prohibit the actions of the mechanical components that may impair the safety of an operator according to predetermined interlock conditions. Various data which are described below are referred to in these processes.

Below, operation modes which indicate the operation states of the first mounting lane L1 and the second mounting lane L2 in the component mounting device 1 are described. In this embodiment, two operation modes, or a first operation mode and a second operation mode are set based on the areas in which the first mounting head 13A and the second mounting head 13B of the first mounting lane L1 and the second mounting lane L2 operate, and appropriately selected in accordance with objects to be mounted. That is, the first operation mode is an operation mode in which the correspondence of one mounting head with the board conveying mechanism which conveys the boards on which the mounting head operates is fixed, and component mounting operations are performed individually and independently in the first mounting lane L1 and the second mounting lane L2, respectively (so-called independence mounting mode). In other words, in the first operation mode, component mounting operations are performed by one component mounting mechanism only on the boards 4 which are held by the board holding part 3 of the board conveying mechanism corresponding to this component mounting mechanism.

In contrast, in the second operation mode, the mounting head which belong to the first mounting lane L1 or the second mounting lane L2 takes as operation objects not only the board conveying mechanism of the mounting lane which the mounting head belongs to but also the board conveying mechanism of the opposite mounting lane. That is, in this operation mode, the mounting heads perform component mounting operations on the boards conveyed by two board conveying mechanism alternately (so-called alternation mounting mode). In other words, in the second operation mode, one component mounting mechanism performs component mounting operations on the boards 4 which are held by the board holding parts 3 of both of the first board conveying mechanism and the second board conveying mechanism.

Thus, since the moving patterns of the mounting head in the first operation mode and the second operation mode are different, first mounting data 22 corresponding to the first operation mode and second mounting data 23 corresponding to the second operation mode are stored in the storage part 21. That is, when the mounting controlling part 20 controls the first mounting lane L1 and the second mounting lane L2 based on the first mounting data 22, component mounting operations are performed in the independence mounting mode. When the mounting controlling part 20 controls the first mounting lane L1 and the second mounting lane L2 based on the second mounting data 23, component mounting operations are performed in the alternation mounting mode.

In this embodiment, first limited movable area data 22a and second limited movable area data 23a, which respectively specify first limited movable areas and second limited movable areas, are included in the first mounting data 22 and the second mounting data 23, respectively. The first limited movable areas and the second limited movable areas are limited areas where the movements of the mounting heads in the horizontal direction are permitted by an action program which forms the mounting data, or movement permission limits of the mounting heads which are set with software. The limited areas where the movement of each of the mounting heads in the horizontal direction is permitted in the first mounting lane L1 and the second mounting lane L2 are set as different areas respectively in accordance with the first operation mode and the second operation mode.

Figure 4:
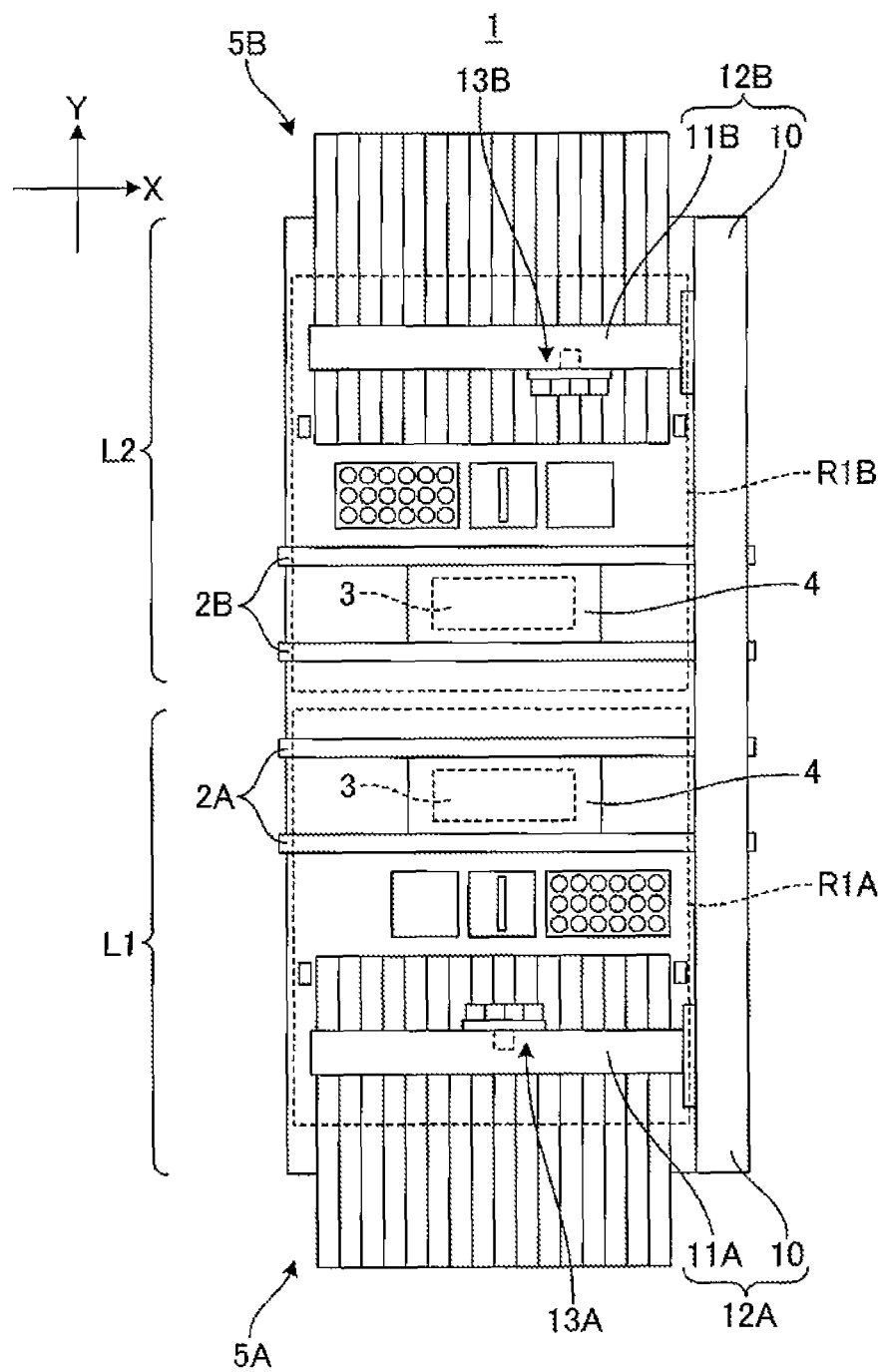
FIG. 4 is an illustrative figure of limited movable areas of mounting heads in the component mounting device of the embodiment of the present invention.

Below, the first limited movable areas and the second limited movable areas are described with reference to FIGS. 4, 5(a) and 5(b). First, FIG. 4 shows first limited movable areas R1A and R1B which are set in accordance with the first operation mode. The first limited movable area R1A shows an area in which the movement in the horizontal direction of the first mounting head 13A which is moved by the first head moving mechanism 12A in the first mounting lane L1 is permitted, and is set as a movable area sufficient for the first mounting head 13A to cover the whole area of a board 4 which is held at the board holding part 3 of the first board conveying mechanism 2A in the first operation mode. That is, in the first limited movable area R1A, the outside limited area is prescribed as a movable area which is necessary for the first mounting head 13A to take out components from the first component supplying part 5A, and the inside limited area is prescribed as an area in which a predetermined margin is added to the periphery of the board holding part 3 in the first board conveying mechanism 2A.

Further, the first limited movable area R1B shows an area in which the movement in the horizontal direction of the second mounting head 13B which is moved by the second head moving mechanism 12B in the second mounting lane L2 is permitted, and is set as a movable area sufficient for the second mounting head 13B to cover the whole area of a board 4 which is held at the board holding part 3 of the second board conveying mechanism 2B in the first operation mode. Similarly, in the first limited movable area R1B, the outside limited area is prescribed as a movable area which is necessary for the second mounting head 13B to take out components from the second component supplying part 5B, and an area in which a predetermined margin is added to the periphery of the board holding part 3 in the second board conveying mechanism 2B becomes the first limited movable area R1B.

Next, FIGS. 5(a) and 5(b) show second limited movable areas R2A and R2B which are set in accordance with the second operation mode. The second limited movable area R2A shown in FIG. 5(a) shows an area in which the movement in the horizontal direction of the first mounting head 13A which is moved by the first head moving mechanism 12A in the first mounting lane L1 is permitted, and is set as a movable area sufficient for the first mounting head 13A to cover the whole areas of boards 4 which are held at the board holding parts 3 of the first board conveying mechanism 2A and the second board conveying mechanism 2B, in the second operation mode. That is, in the second limited movable area R2A, the outside limited area is prescribed as a movable area which is necessary for the first mounting head 13A to take out components from the first component supplying part 5A, and the inside limited area is prescribed as an area in which a predetermined margin is added to the periphery of the board 4 in the second board conveying mechanism 2B.

Further, the second limited movable area R2B shown in FIG. 5(b) shows an area in which the movement in the horizontal direction of the second mounting head 13B which is moved by the second head moving mechanism 12B in the second mounting lane L2 is permitted, and is set as a movable area sufficient for the second mounting head 13B to cover the whole areas of boards 4 which are held at the board holding parts 3 of the first board conveying mechanism 2A and the second board conveying mechanism 2B, in the second operation mode. That is, in the second limited movable area R2B, the outside limited area is prescribed as a movable area which is necessary for the second mounting head 13B to take out components from the second component supplying part 5B, and the inside limited area is prescribed as an area in which a predetermined margin is added to the periphery of the board 4 in the first board conveying mechanism 2A.

Thus, the following effects are obtained by setting the limited areas in which the movements in the horizontal direction of the respective mounting heads in the first mounting lane L1 and the second mounting lane L2 are permitted as different areas respectively in accordance with the first operation mode and the second operation mode. That is, when the component mounting device 1 operates in the first operation mode and a device type changing operation is performed in one mounting lane, if the mounting head of the opposite mounting lane which is operating enters into the area of the mounting lane in which the device type changing operation is being performed, a non-safety state due to the contact of an operator with the mounting head may occur for some reason. Even in this case, because the limited movable areas of the mounting heads in the first operation mode are set in the present embodiment, a situation that the mounting head of the mounting lane which is operating enters into the area of the mounting lane in which the device type changing operation is being performed will not occur, and the safety of the operator is secured.

Figure 8:
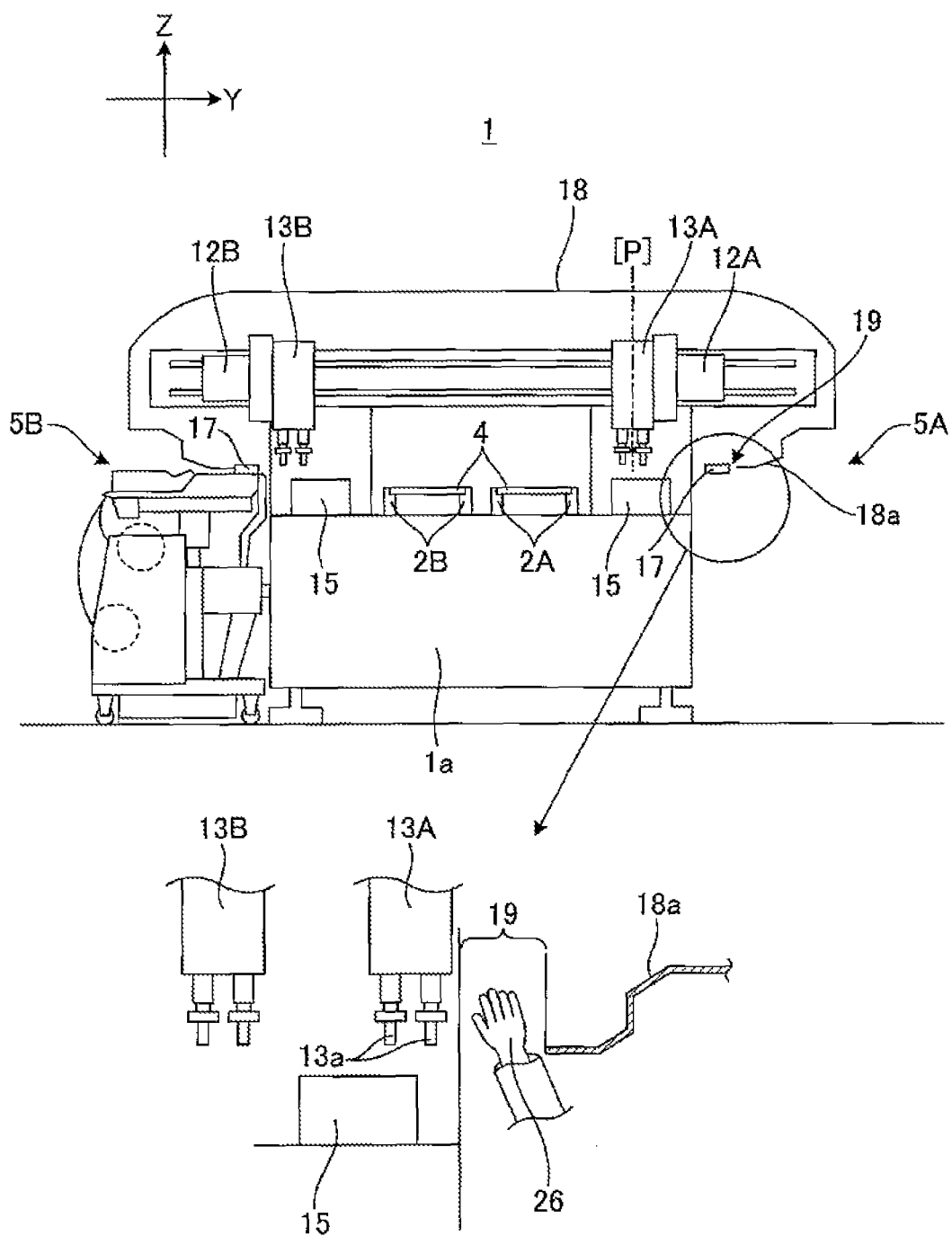
FIG. 8 is an illustrative figure of the safety securing method in the device type changing operation in the component mounting method of the embodiment of the present invention.
Figure 9:
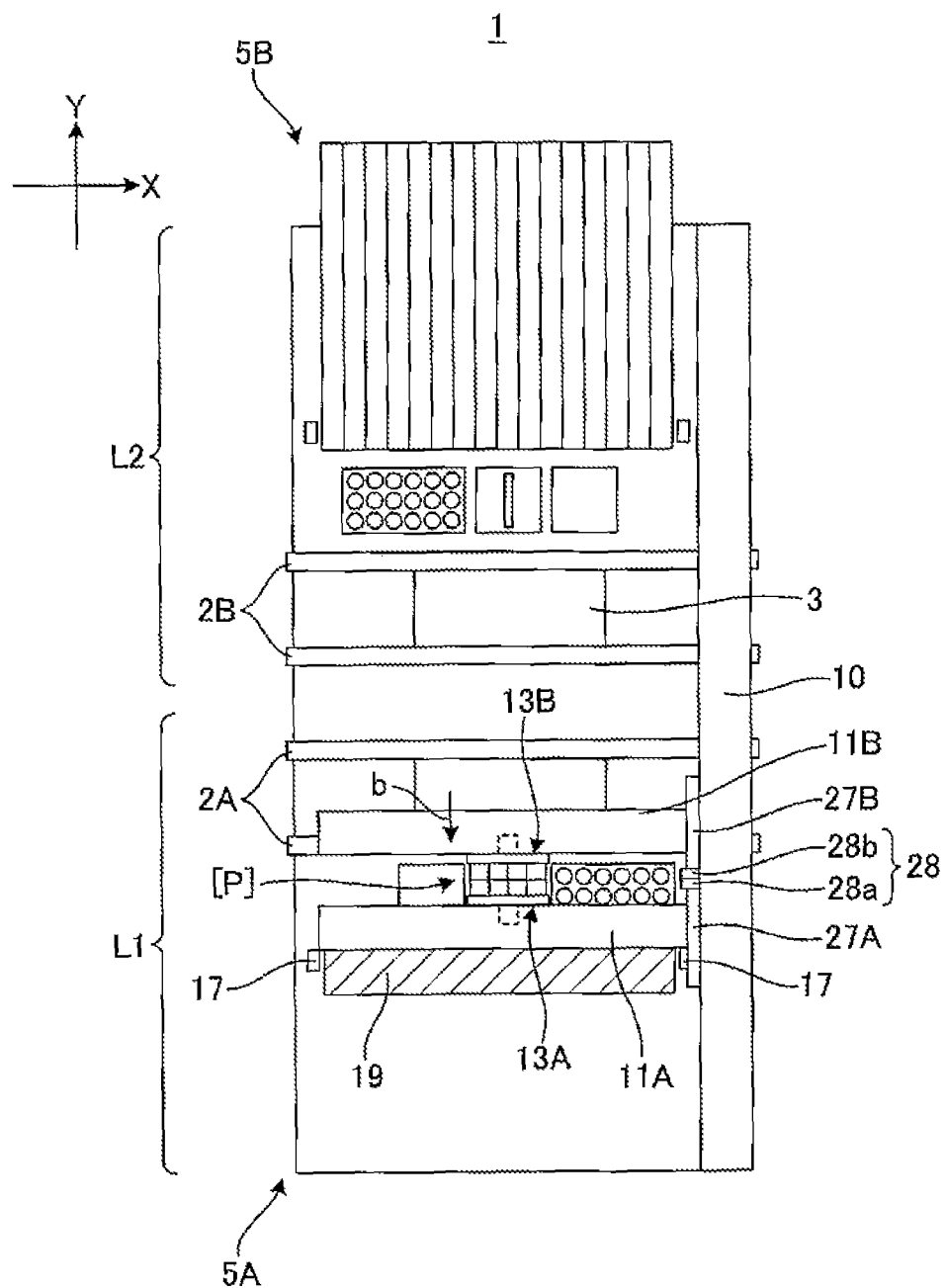
FIG. 9 is an illustrative figure of the safety securing method in the device type changing operation in the component mounting method of the embodiment of the present invention.
Figure 10:
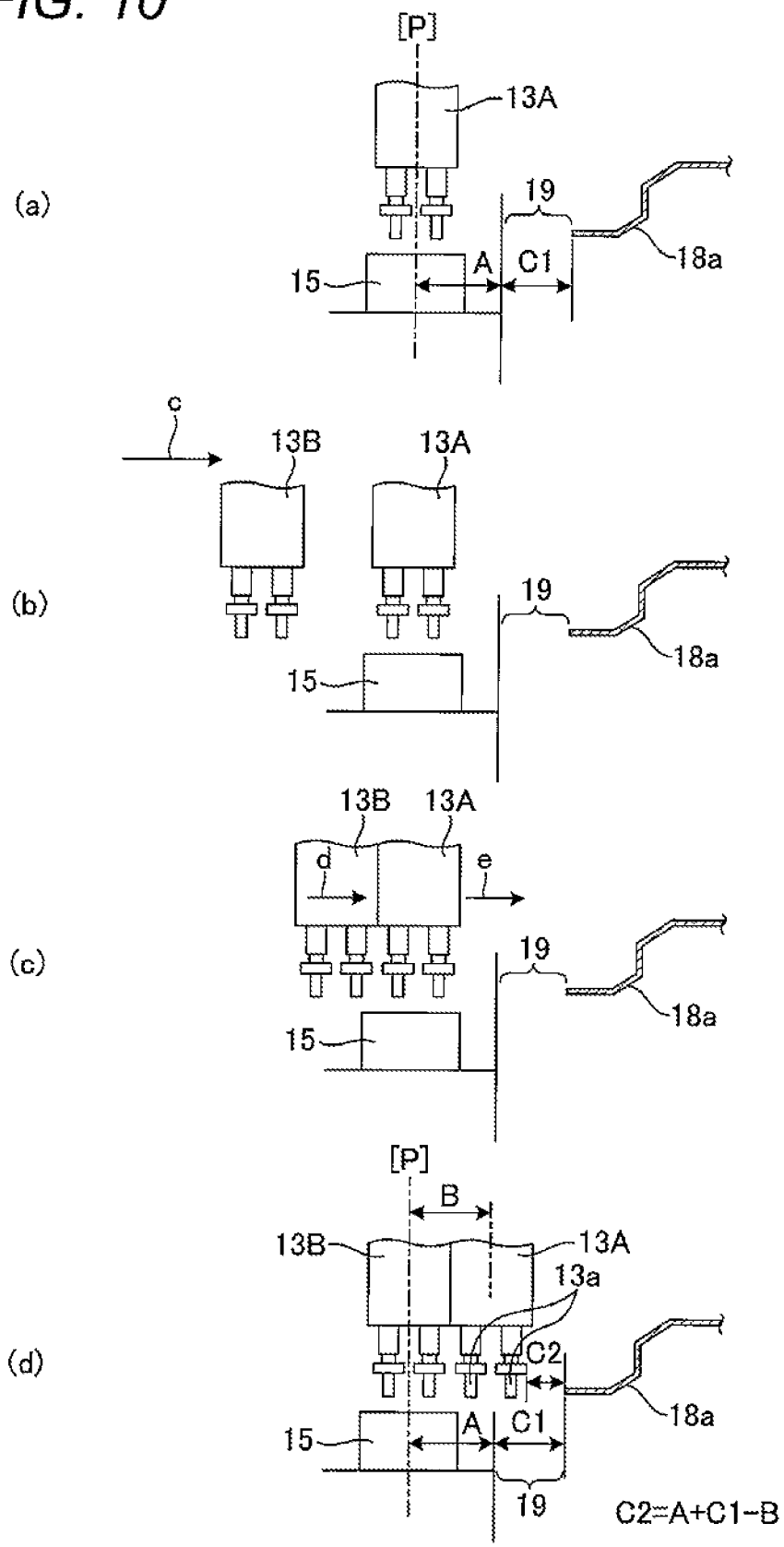
FIGS. 10(a) to 10(d) are illustrative figures of the safety securing method in the device type changing operation in the component mounting method of the embodiment of the present invention.

Head withdraw position data 24 are data which prescribe withdraw positions [P] (refer to FIGS. 8 to 10 (d)) to which the first mounting head 13A and the second mounting head 13B are withdrawn for the safety of an operator when a device type changing operation is performed in one mounting lane in the first operation mode. The detailed and technical senses of the withdraw positions [P] are described in detail in the examples of actions described later. The recognition processing part 25 performs recognition processes on imaging results of the board recognition cameras 14 and the component recognition cameras 15. Thereby, while the component mounting point of a board 4 for the mounting is recognized, and a component which is held by the first mounting head 13A or the second mounting head 13B is recognized. The recognition results are transmitted to the mounting controlling part 20, and when the component is loaded on the board 4 by the first mounting head 13A or the second mounting head 13B, the mounting controlling part 20 controls the first head moving mechanism 12A or the second head moving mechanism 12B by taking the recognition results into consideration.

Detection results from the tape feeder float detecting sensors 17 are transmitted to the mounting controlling part 20. At this time, when the carriage 7 in which the tape feeders 6 are arranged is installed in the first component supplying part 5A or the second component supplying part 5B, the mounting controlling part 20 informs the abnormality of the installing state of the tape feeders 6 based on the detection results from the tape feeder float detecting sensors 17. During the device type changing operation, when the mounting controlling part 20 receives a detection signal from the tape feeder float detecting sensors 17, the mounting controlling part 20 makes the interlock processing part 20b perform an action control process which is necessary to secure the safety of an operator according to the predetermined interlock to conditions.

Then, schemes of securing the safety of an operator when the component mounting device 1 is operating in the first operation mode (independence mounting mode) and a device type changing operation is performed in one mounting lane (the first mounting lane L1 here) while the production is continued in the other mounting lane (the second mounting lane L2 here), are described with reference to the figures and following a processing flow of the component mounting operation of FIG. 6.

Figure 5:
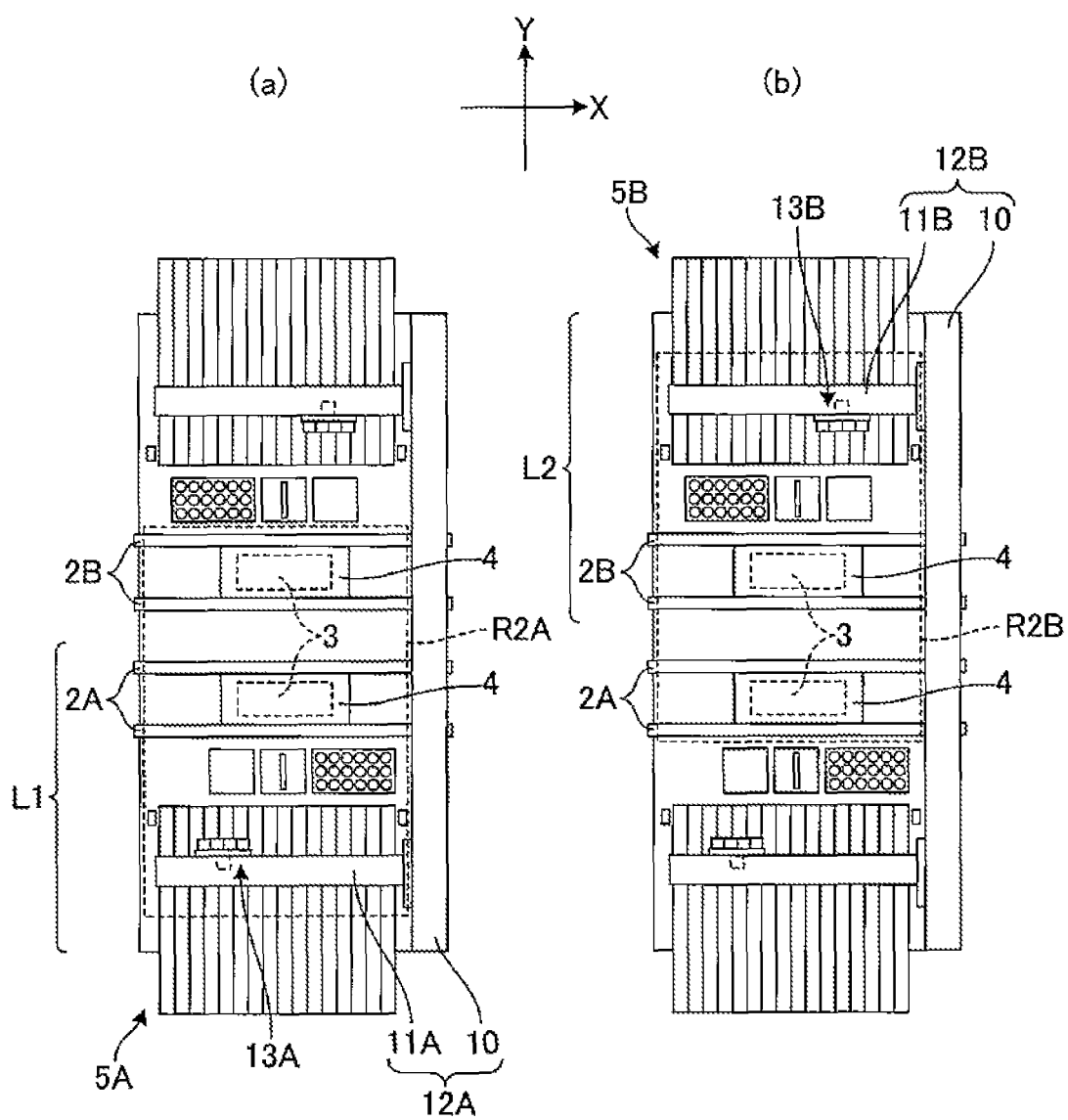
FIGS. 5(a) and 5(b) are illustrative figures of limited movable areas of the mounting heads in the component mounting device of the embodiment of the present invention.
Figure 6:
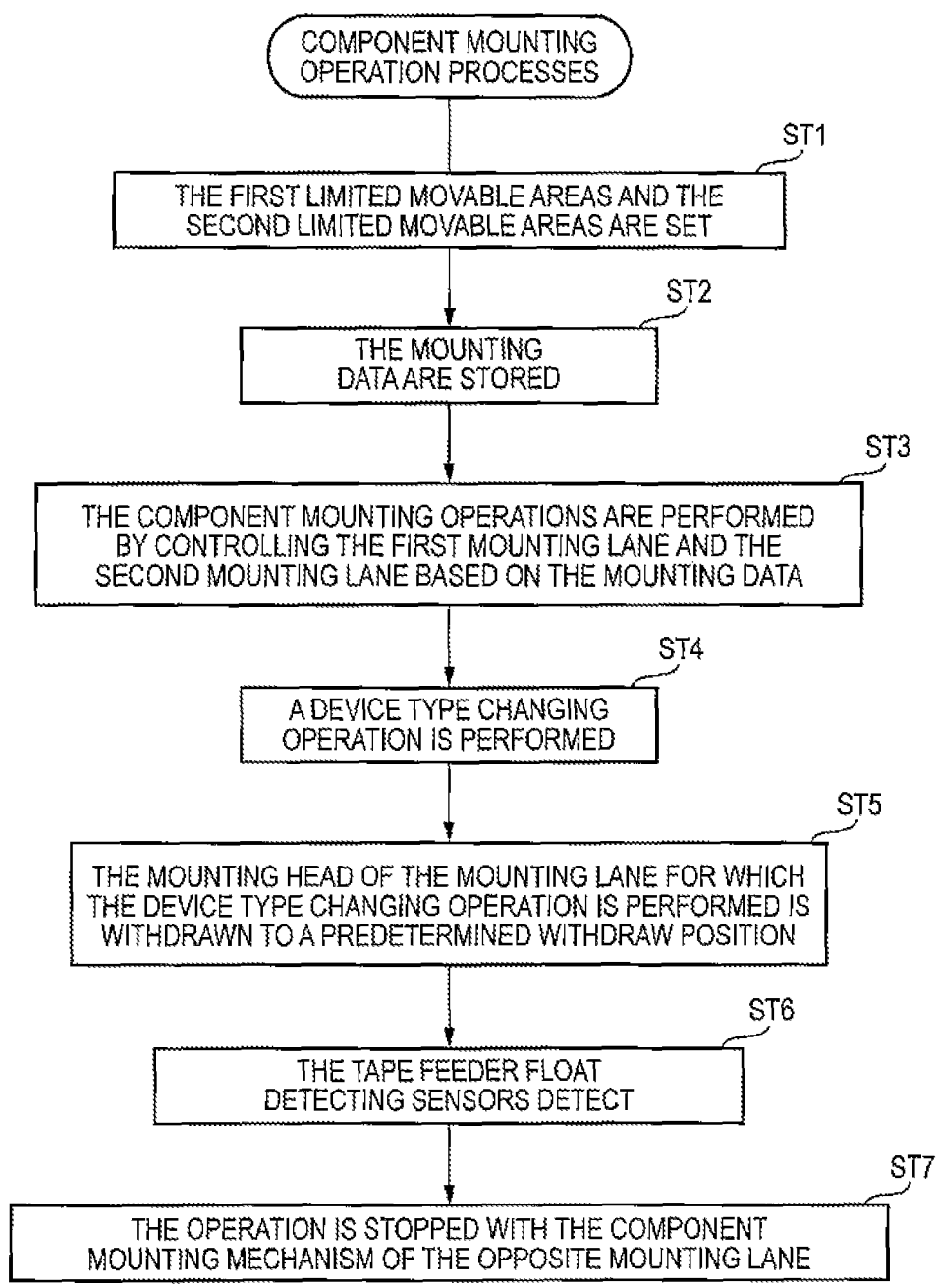
FIG. 6 is a flow diagram of the processes of component mounting operations in a component mounting method of one embodiment of the present invention.

In FIG. 6, first, the first limited movable areas and the second limited movable areas which are respectively included in the first mounting data 22 and the second mounting data 23 shown in FIG. 3 are set (ST1). That is, as shown in FIG. 4, the first limited movable areas R1A and R1B are set in accordance with the first mounting lane L1 and the second mounting lane L2, respectively, and as shown in FIGS. 5(*a*) and 5(*b*), the second limited movable areas R2A and R2B are set in accordance with the first mounting lane L1 and the second mounting lane L2, respectively (ST1).

Then, the first mounting data 22 and the second mounting data 23 in which the above mentioned first limited movable areas R1A and R1B and the second limited movable areas R2A and R2B are set, respectively, are stored in the storage part 21 (a mounting data storing step), (ST2). That is, prior to the mounting data storing step, the first limited movable areas R1A and R1B and the second limited movable areas R2A and R2B are set as different areas in accordance with the first operation mode and the second operation mode, respectively, in the first mounting data 22 and the second mounting data 23.

When component mounting operations are started by the component mounting device 1, the mounting controlling part 20 performs the component mounting operations which mount components on the board 4 which is imported from upstream by controlling the first mounting lane L1 and the second mounting lane L2 based on the mounting data stored in the storage part 21 (mounting control step) (ST3). Here, when the component mounting operations are continuously performed in the first operation mode, if the production lot for one board type is completed in one of the first mounting lane L1 and the second mounting lane L2, a device type changing operation is performed for the mounting lane (ST4).

When the device type changing operation is performed with the change of the type of boards which are the mounted objects in one of the first mounting lane L1 and the second mounting lane L2, for the purpose of securing the safety of a working operator, safety securing schemes described below are performed. That is, first, the mounting head of the mounting lane which is the object of the device type change is withdrawn to a predetermined withdraw position which is set beforehand, with a function of the safe action processing part 20*a* (ST5). Here, the first mounting lane L1 becomes the object of the device type changing operation, and the first mounting head 13A is moved to the withdraw position [P] shown in FIG. 7 and fixed to the position with a braking function that a linear motor mechanism of the Y axis movable table 10 has (a mounting head withdrawing step). When the second mounting lane L2 becomes the object of the device type changing operation, the second mounting head 13B is withdrawn to a withdraw position [P] which is set similarly to the side of the first mounting lane L1.

It is detected with a linear encoder function (not shown in the figures) which is built in the Y axis movable table 10 that the first mounting head 13A or the second mounting head 13B is located at the withdraw positions [P] in this way, and the detection result is transmitted to the mounting controlling part 20. That is, the linear encoder function that is built in the V axis movable table 10 functions as a position detecting means to detect that the first mounting head 13A or the second mounting head 13B stops at the withdraw position [P]. The mounting controlling part 20 sets an interlock condition so that the component mounting operation in the opposite mounting lane is started only when it is ensured with this position detecting means that the first mounting head 13A or the second mounting head 13B is located at the withdraw position [P].

Figure 7:
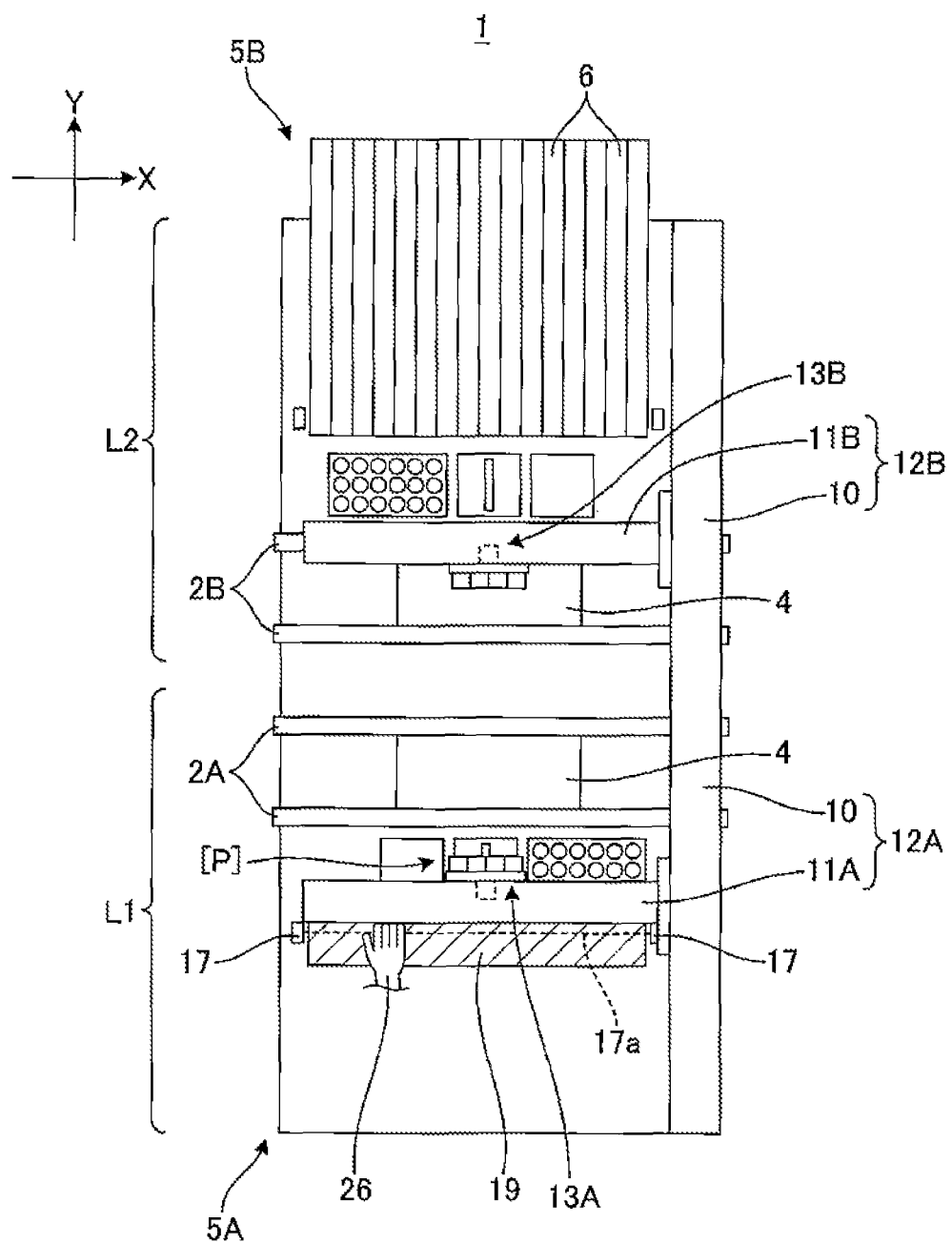
FIG. 7 is an illustrative figure of a safety securing method in a device type changing operation in the component mounting method of the embodiment of the present invention.

In the device type changing operation, as shown in FIGS. 7 and 8, the carriage 7 on which the tape feeders 6 are arranged is drawn out from the first component supplying part 5A of the first mounting lane L1 which is the object, and a feeder changing operation of changing the tape feeders 6 in accordance with the next board type is performed. At this time, in the first component supplying part 5A, because the carriage 7 located below the opening part 19 which is provided at the end of protective cover part 18*a* is removed, and the opening part 19 is in an open condition, as shown in FIGS. 7 and 8, it is possible that an operator makes foreign objects such as fingers 26 or a working tool enter into the movable area of the movable mechanism which forms the component mounting mechanism through the opening part 19. In this situation, because an accident is predicted in which the movable mechanism such as the mounting head comes in contact with the fingers 26 that the operator made enter carelessly from the opening part 19, in the present embodiment, the safety of the operator is secured definitely with a plurality of safety securing schemes as described below.

First, the safety securing effect is achieved by limiting the movement of the second mounting head 13B with the first limited movable area set in the first mounting data 22. That is, because even if the production is continued in the second mounting lane L2, a movement limit is provided with a control program so that the second mounting head 13B will not move beyond the first limited movable area R1B and to the side of the first mounting lane L1, the situation that the operator who performs the operation on the first component supplying part 5A of the first mounting lane L1 is in a non-safe condition due to the movement of the second mounting head 13B will not occur.

Next, the safety securing effect is achieved with the interlock of the action of the second mounting head 13B which is linked to the detection results of the tape feeder float detecting sensors 17 which are arranged in the first component supplying part 5A. That is, in this embodiment, even when the carriage 7 is separated and removed from the first component supplying part 5A, the detection functions of the tape feeder float detecting sensors 17 are kept in an ON state. Therefore, as shown in FIGS. 7 and 8, when the fingers 26 which are a part of the body of the operator or a foreign object such as the working tool enter through the opening part 19 from below for some reason, these entries are detected since the detection optical axis 17*a* of the tape feeder float detecting sensors 17 is interrupted (ST6). If the tape feeder float detecting sensors 17 detect these entries, the interlock processing part 20*b* stops not only the operation of the first mounting head 13A that is already in a stop state at the time of the device type changing operation, but also the operation of the second mounting head 13B with the component mounting mechanism of the opposite second mounting lane L2 which is working (ST7). Thereby, even when the second mounting head 13B malfunctions due to control abnormality, the second mounting head 13B will not move towards the first component supplying part 5A. Even if the safety securing scheme of the limited movable areas which are set with the above-mentioned control program does not function normally for some reason, the safety of the operator is secured with this interlock.

In the present embodiment, the withdraw position [P] to which the first mounting head 13A or the second mounting head 13B is withdrawn when the device type changing operation is performed with the change of the type of the boards which are the mounted objects in the first mounting lane L1 or the second mounting lane L2 is set at a position which meets the conditions described below. That is, the withdraw position [P] is set at a position so that the behavior that an operator makes a part of the body or a foreign object enters through the opening part 19 which is provided at the protective cover part 18a which separates the movable area of the component mounting mechanism from the component supplying part can be blocked by the mounting head of the component mounting mechanism which belongs to the concerned mounting lane, and the safety of the operator is not impaired by the operation of the component mounting mechanism which belongs to the mounting lane opposite to the concerned mounting lane.

In particular, as shown in FIG. 8, the withdraw position [P] is set so that the first mounting head 13A is located above the component recognition camera 15. Thereby, when the first X axis movable table 11A is located above the opening part 19 and the fingers 26 or the like enter from the opening part 19, the fingers 26 or the like are hindered by the first X axis movable table 11A and the first mounting head 13A from entering into the side of the first board conveying mechanism 2A and the second board conveying mechanism 2B.

Furthermore, it is considered in the setting of the withdraw position [P] that even if the opposite mounting head which is operating is assumed to be recklessly driven, and collides with the standby mounting head at the withdraw position [P], the safety of the operator is secured. That is, the withdraw position [P] is set at a position so that the concerned mounting head is located closer to the board conveying mechanism side than the opening part 19 where the concerned mounting head accesses a component supplying part to pick up components, and even if the mounting head of the component mounting mechanism which belongs to the opposite mounting lane is driven recklessly due to control abnormality and collides with the mounting head of the concerned mounting lane, a movement margin can be secured so that a part of the body, such as the fingers 26, or a foreign object which enter inside the opening part 19 will not be sandwiched between the mounting head which moves due to the collision and an end of the opening part 19.

Details of the above withdraw position [P] and the movement margin are described with reference to FIGS. 9 and 10(a) to 10(d). FIG. 9 shows that the second mounting head 13B which is recklessly driven (arrow b) from the side of the second mounting lane L2 due to control abnormality collides with the standby first mounting head 13A at the withdraw position [P] in the first mounting lane L1 in the device type changing operation. In a structure where the first X axis movable table 11A and the second X axis movable table 11B are driven by the common V axis movable table 10, an approaching part 28a and a detecting part 28b which form an interference sensor 28 are installed to a moving plate 27A of the first X axis movable table 11A and a moving plate 27B of the second X axis movable table 11B, respectively. When the first X axis movable table 11A and/or the second X axis movable table 11B which are acting approach to each other, and the approaching part 28a and the detecting part 28b are within a predetermined distance, an interference signal is output from the interference sensor 28 and the first X axis movable table 11A and/or the second X axis movable table 11B are stopped.

However, when the interference sensor 28 does not operate normally, it would occur that the moving second X axis movable table 11B collides with the stopped first X axis movable table 11A. For this reason, in this embodiment, the withdraw position [P] of the first X axis movable table 11A is set at an appropriate position so that the safety of an operator is secured even if the first X axis movable table 11A and the second X axis movable table 11B collide due to the malfunction of the interference sensor 28. FIG. 10(a) shows that the first mounting head 13A in the mounting lane at the device type changing side is withdrawn to a withdraw position [P] which is set above and around the component recognition camera 15. Here, the withdraw position [P] is set at a position only in a distance A from an end of the opening part 19 which has an opening width C1.

Then, as shown in FIG. 10(b), the second mounting head 13B moves from the side of the second mounting lane L2 (arrow c), and as shown in FIG. 10(c), collides with the standby first mounting head 13A in a stop state (arrow d). Due to this collision, the first mounting head 13A in the stop state moves from the withdraw position [P] in the same direction as the moving direction of the second mounting head 13B (arrow e). Thereby, the first mounting head 13A moves a movement margin B from the withdraw position [P]. The movement margin B is prescribed based on the braking force of a brake mechanism which fixes the first mounting head 13A to the withdraw position [P], the collision speed of the second mounting head 13B at the time of the collision, and the like. Due to this collision, the first mounting head 13A moves and protrudes to a position above the opening part 19, as shown in FIG. 10(d).

At this time, when the first mounting head 13A moves to cover the opening part 19 from above and the fingers 26 of the operator enter inside the opening part 19, it occurs that the fingers 26 are sandwiched between the first mounting head 13A and the end of the opening part 19. Thus, to prevent the non-safety state that may lead to such a work-related accident, in the present embodiment, the position of the withdraw position [P] is set so that there is a remaining gap C2 enough for the fingers 26 not to be sandwiched between the end of the opening part 19 and the first mounting head 13A even if in the above case.

That is, the remaining gap C2 is a dimension of subtracting the movement margin B from the sum of the distance A and the opening width C1 and is represented with C2=A+C1−B. The opening width C1 is known as a fixed value, and the movement margin B also can be obtained by means of a trial based on acting conditions such as the head moving speed of the mounting head at the collision side and the brakes strength of the mounting head in the stop state. Therefore, by suitably setting the distance A, the remaining gap C2 of an enough width can be secured so that the non-safety state that the fingers 26 are sandwiched between the first mounting head 13A and the end surface of the protective cover part 18a will not occur even if the fingers 26 of the operator have entered inside the opening part 19.

In the present embodiment, when it is detected by the above-mentioned position detecting means that the mounting head in the mounting lane for which the device type changing operation is performed is located at the above-mentioned withdraw position [P], and it is ensured that this position detection is performed normally, the component mounting operation in the opposite mounting lane is started. Thereby, if the mounting head is not located at the normal withdraw position [P], the device type changing operation and the component mounting operation in the opposite mounting lane are not performed, and the safety securing scheme is ensured definitely.

As described above, in the component mounting device shown in the present embodiment, the safety of an operator in the device type changing operation during the device operation in the first operation mode is secured with a plurality of safety securing schemes. That is, first, as the first safety securing scheme, it is prevented that the mounting head of the opposite mounting lane enters into the mounting lane of the device type changing side by setting the areas in which the movements in the horizontal direction of the mounting heads in the first mounting lane L1 and the second mounting lane L2 are permitted as the limited movable areas which are set with the control program.

Next, as the second safety securing scheme, when an operator makes a part of the body such as fingers 26 or a foreign object enter from the opening part 19 which is provided in the first component supplying part 5A or the second component supplying part 5B, these entries are detected by the tape feeder float detecting sensors 17 and the action of the mounting head of the opposite mounting lane is stopped based on this detection result. Further, if it is assumed that the above-mentioned first and second safety securing schemes do not operate normally for some reason, as the third safety securing scheme, the withdraw position [P] of the mounting head of the device type changing side is set at a position so that the safety of the operator is secured even if the mounting head of the opposite mounting lane is recklessly driven, and collides with the mounting head at the withdraw position.

Thus, in the component mounting device 1 which operates in the independence mounting mode in which each of the two mounting lanes performs component mounting operations individually, when a device type changing operation is performed in one mounting lane and the production is continued in the opposite mounting lane, by adopting the plurality of safety securing schemes for the operator as described above, a conventionally impossible operation pattern in which the device type changing operation is performed while the opposite mounting lane is operating is implemented. That is, in the component mounting device which includes the plurality of mounting lanes, the device type changing operation with the change of the board type can be performed without stopping the operation of the opposite mounting lane and without impairing the safety of the operator.

Although the invention is described in detail with reference to specific embodiments, it is apparent that various modifications and amendments may be made by those skilled in the art without departing from the spirit and scope of the invention.

This application is based on the Japanese patent application (patent application 2011-009648) filed on Jan. 20, 2011, whose content is incorporated herein by reference.

INDUSTRIAL APPLICABILITY

The component mounting device and the component mounting method of the invention have an effect that the device type changing operation with the change of the board type can be performed in the component mounting device which includes a plurality of mounting lanes, without stopping the operation of the opposite mounting lane and without impairing the safety of the operator, and are useful in the field of manufacturing mounted boards by mounting components on the wired boards.

DESCRIPTION OF THE SYMBOLS 1 component mounting device
2A first board conveying mechanism
2B second board conveying mechanism
3 board holding part
4 board
5A first component supplying part
5B second component supplying part
6 tape feeder
7 carriage
9 carrier tape
10 Y axis movable table
11A first X axis movable table
11B second X axis movable table
12A first head moving mechanism
12B second head moving mechanism
13A first mounting head
13B second mounting head
13a adsorbing nozzle
17 tape feeder float detecting sensor
18 whole cover member
18a protective cover part
19 opening part
20. [P] withdraw position

The invention claimed is:

1. A component mounting device, comprising:
a first board conveying mechanism and a second board conveying mechanism which convey boards delivered from an upstream device in a board conveying direction, and have board holding parts which position and hold the boards, respectively;
a first component supplying part and a second component supplying part which are provided respectively beside the first board conveying mechanism and the second board conveying mechanism and supply components to be mounted on the boards;
a first component mounting mechanism and a second component mounting mechanism which take out the components with mounting heads from the first component supplying part and the second component supplying part which are provided respectively in accordance with the first board conveying mechanism and the second board conveying mechanism and mount on the boards which are held by a board holding part of the first board conveying mechanism and a board holding part of the second board conveying mechanism; and
a mounting controlling part which controls a first mounting lane composed of the first board conveying mechanism, the first component supplying part and the first component mounting mechanism and a second mounting lane composed of the second board conveying mechanism, the second component supplying part and the second component mounting mechanism, based on mounting data stored in a storage part;
wherein the mounting data contains a first mounting data corresponding to a first operation mode in which any one of the component mounting mechanisms performs component mounting operations only on the boards which are held by the board holding part of the board conveying mechanism corresponding to the any one of the component mounting mechanisms, and a second mounting data which correspond to a second operation mode in which any one of the component mounting mechanisms performs component mounting operations on the boards which are held by the board holding parts of both the first board conveying mechanism and the second board conveying mechanism, and
a first limited movable area and a second limited movable area which respectively indicate areas in which movements of the mounting heads in the horizontal direction in the first mounting lane and the second mounting lane are permitted are set as different areas in accordance with the first operation mode and the second operation mode, respectively, in the first mounting data and the second mounting data, wherein the first limited movable area is set as a movable area sufficient for the mounting head of the first component mounting mechanism to cover a whole area of the board which is held at the board holding part of the first board conveying mechanism in the first operation mode and as a movable area sufficient for the mounting head of the second component mounting mechanism to cover the whole area of the board which is held at the board holding part of the second board conveying mechanism in the first operation mode, and the second limited movable area is set as a movable area sufficient for the mounting head of the first component mounting mechanism to cover the whole area of the board which is held at the board holding part of any one of the first board conveying mechanism and the second board conveying mechanism in the second operation mode and as a movable area sufficient for the mounting head of the second component mounting mechanism to cover the whole area of the board which is held at the board holding part of any one of the first board conveying mechanism and the second board conveying mechanism in the second operation mode.

2. A component mounting method with which components are mounted on boards by a component mounting device comprising a first board conveying mechanism and a second board conveying mechanism which convey the boards delivered from upstream devices in board conveying directions, and have board holding parts which position and hold the boards, respectively, a first component supplying part and a second component supplying part which are provided respectively beside the first board conveying mechanism and the second board conveying mechanism and supply the components to be mounted on the boards, and a first component mounting mechanism and a second component mounting mechanism which take out the components with mounting heads from the first component supplying part and the second component supplying part which are provided respectively in accordance with the first board conveying mechanism and the second board conveying mechanism and mount on the boards which are held by a board holding part of the first board conveying mechanism and a board holding part of the second board conveying mechanism, comprising a mounting data storing step of storing mounting data which contain first mounting data which correspond to a first operation mode in which any one of the component mounting mechanisms performs component mounting operations only on the boards which are held by the board holding part of the board conveying mechanism corresponding the any one of the component mounting mechanisms and second mounting data which correspond to a second operation mode in which any one of the component mounting mechanisms performs component mounting operations on the boards which are held by the board holding parts of both the first board conveying mechanism and the second board conveying mechanism, in a storing part, and a mounting control step of controlling a first mounting lane which comprises the first board conveying mechanism, the first component supplying part and the first component mounting mechanism and a second mounting lane which comprises the second board conveying mechanism, the second component supplying part and the second component mounting mechanism, based on the mounting data, wherein before the mounting data storing step, first limited movable areas and second limited movable areas which respectively indicate areas in which the movements in the horizontal direction of the mounting heads in the first mounting lane and the second mounting lane are permitted are set as different areas in accordance with the first operation mode and the second operation mode, respectively, in the first mounting data and the second mounting data, wherein the first limited movable areas are set as a movable area sufficient for the mounting head of the first component mounting mechanism to cover the whole area of the board which is held at the board holding part of the first board conveying mechanism in the first operation mode and as a movable area sufficient for the mounting head of the second component mounting mechanism to cover the whole area of the board which is held at the board holding part of the second board conveying mechanism in the first operation mode, and the second limited movable areas are set as a movable area sufficient for the mounting head of the first component mounting mechanism to cover the whole area of the board which is held at the board holding part of any one of the first board conveying mechanism and the second board conveying mechanism in the second operation mode and as a movable area sufficient for the mounting head of the second component mounting mechanism to cover the whole area of the board which is held at the board holding part of any one of the first board conveying mechanism and the second board conveying mechanism in the second operation mode.

* * * * *